United States Patent
Cosand

(10) Patent No.: US 6,597,303 B2
(45) Date of Patent: *Jul. 22, 2003

(54) COMPARATOR WITH VERY FAST REGENERATION TIME CONSTANT

(75) Inventor: Albert E. Cosand, Agoura Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/931,609

(22) Filed: Aug. 16, 2001

(65) Prior Publication Data

US 2003/0034804 A1 Feb. 20, 2003

(51) Int. Cl.[7] .................................................. H03M 1/34
(52) U.S. Cl. ........................................ 341/165; 341/155
(58) Field of Search ........................... 341/165, 144, 341/155, 156; 327/57, 65, 203; 330/257; 257/588

(56) References Cited

U.S. PATENT DOCUMENTS

| | | | |
|---|---|---|---|
| 4,083,043 A | | 4/1978 | Breuer ........................ 341/165 |
| 4,147,943 A | * | 4/1979 | Peterson ....................... 327/65 |
| 4,218,675 A | * | 8/1980 | Shaw et al. ................. 341/156 |
| 4,329,656 A | * | 5/1982 | Shaw .......................... 330/257 |
| 4,421,996 A | * | 12/1983 | Chuang et al. ................ 327/57 |
| 4,982,119 A | * | 1/1991 | Tateishi ........................ 327/65 |
| 5,023,475 A | * | 6/1991 | Ducourant ................... 327/203 |
| 5,028,815 A | * | 7/1991 | Van De Plassche ........... 327/65 |
| 5,216,276 A | * | 6/1993 | Takada ........................ 257/588 |

OTHER PUBLICATIONS

Van de Plassche, R., *Integrated Analog–to–Digital and Digital–to–Analog Converters*, Klever Academic Publishers, pp. 121–122, (1994).

Breuer, D.R., "High–Speed A/D Converter Monolithic Techniques," *IEEE International Solid State Circuits Conference*, pp. 146–147 and 288 (Feb. 1972).

* cited by examiner

Primary Examiner—Jean Bruner Jeanglaude
(74) Attorney, Agent, or Firm—Ladas & Parry

(57) ABSTRACT

A comparator comprises a cross-coupled regenerative latch, a circuit connected to the cross-coupled regenerative latch and a clocking circuit. The cross-coupled regenerative latch regenerates, during a latching mode, a signal which is indicative of a difference between two input signals. The circuit connected to the cross-coupled regenerative latch operates as a voltage follower during an acquisition mode and as a cascode amplifier stage during the latching mode. The clocking circuit switches the comparator from the acquisition mode to the latching mode and vice versa. The comparator eliminates the extraneous loading from the positive feedback when the regeneration takes place, so that a very fast regeneration time constant is obtained.

53 Claims, 5 Drawing Sheets

COMPARATOR WITH VERY FAST REGENERATION TIME CONSTANT

BACKGROUND OF THE INVENTION

1. Field of the Invention

The present invention relates to comparator circuits. More particularly, it relates to a comparator having a latching circuit, in which the coupling of the input signal into the latch and/or the coupling of the output signal from the latch are designed to minimize the internal loading of the latch. The reduced loading allows this comparator circuit, when it is switched from acquisition (or tracking) mode to latching (or regenerative) mode, to resolve a very small input difference into a full logic level more rapidly than any previously known comparator circuit implemented with a given transistor technology.

A latching comparator determines, at a particular instant, which of two voltages is larger, or equivalently, determines the sign of a voltage difference. The output of the comparator is generally a logic voltage level compatible with the inputs of some particular logic circuitry. If the voltage difference to be resolved is small compared to the logic voltage swing, some period of time is required after the comparator is clocked for the voltage to be amplified to a recognizable logic level. A small input voltage difference generally begins to grow at an exponential rate, characterized by a so-called "regeneration time constant", when the comparator clock signal is switched. The smallest voltage difference that can be resolved by the comparator in a given period of time is limited by the value of this constant. This means that if an input difference is too small it will not produce a valid logic signal in the allotted time interval.

2. Description of the Related Art

The best regeneration time for prior art comparator circuits is achieved with a differential current-mode latch with the input and output coupled into taps in the collector load resistors of the latch. See, for instance, R. Van de Plassche, *Integrated Analog-to-Digital and Digital-to-Analog Converters*, Klever Academic Publishers, 1994, pp. 121–122. However, the input transistor collectors and output transistor bases still significantly load the latch.

In the usual prior art implementation of a clocked latching comparator, a clock signal switches the comparator between an acquisition mode and a latching mode. In the acquisition mode the comparator has a relatively low gain and the output follows the signal input. When the comparator is clocked into the latching mode, positive feedback is enabled so that any arbitrarily small signal that is present will regenerate and drive the latch to its full output swing. When the signal is small, the rate of growth is proportional to the signal voltage present at any given time. This means that the regeneration is characteristically exponential in time, with a regeneration time constant $T_r$. If the clock timing for the comparator allows some time T for regeneration, the input signal should be at least $\exp(-T/T_r) \cdot V_{sw}$ to be resolved, where $V_{sw}$ is the value of a full logic swing. Smaller inputs will not be able to reach a full logic swing and may not be correctly resolved by the subsequent logic. This undesired condition is referred to as comparator (or latch) metastability.

The regeneration time constant for a comparator (or, in general, any latch) is determined primarily by the gain in the positive feedback loop and by the loading of various capacitances in the circuit.

FIG. 1 shows a simplified electrical circuit of a prior art differential current-mode latch. An example of this circuit can be for example found in U.S. Pat. No. 4,083,043 to D. R. Breuer and in D. R. Breuer, 'High-speed A/D Converter Monolithic Techniques', International Solid State Circuits Conference Proceedings, February 1972, pp. 146–147 and 228.

The circuit of FIG. 1 comprises an input differential pair of transistors Q1–Q2, a latch differential pair of transistors Q3–Q4, a clock differential pair of transistors Q5–Q6, load resistors R1 and R2 and a current source I1. The clock differential pair Q5–Q6 steers the current from the current source I1 into either the input differential pair Q1–Q2 when the clock input signal CLK is high, or into the latch differential pair Q3–Q4 when the clock signal CLKX is high. CLK and CLKX are complementary signals; when one is low the other is high and vice versa.

When the clock signal CLK is high, the input differential pair Q1–Q2 operates as a transconductor which converts the input voltage difference at the bases of Q1 and Q2 to a difference in the collector currents of Q1 and Q2. The collector currents flow into the high impedance of the load resistors R1 and R2 at the nodes A and B of FIG. 1 and create a voltage difference between these nodes which is an amplified replica of the input voltage difference at the bases of Q1 and Q2.

When the differential clock voltage is switched so that CLK goes low and CLKX goes high, the input pair Q1–Q2 is deactivated and the latch pair Q3–Q4 becomes active. The latch pair Q3–Q4 and the load resistors R1 and R2 form a very high gain positive-feedback amplifier such that any voltage present between A and B will be amplified (or "regenerated") until the latch is driven to a saturated output. The output of the comparator may be taken either directly from A and B as shown in FIG. 1 or through some sort of buffer amplifier that has its inputs connected to A and B.

To use this circuit as a strobed comparator, the voltage difference to be compared is applied between the input signals IN and INX while the clock signal CLK is high. At the time the comparison is to be made, the clock signal CLKX is rapidly switched high so that the amplified input voltage differential serves as the starting point for the latch to regenerate to a saturated output level. The rate of regeneration depends inversely on the capacitive loading at the high impedance nodes A and B. In a conventional integrated circuit implementation of the comparator, this loading essentially consists of:

a) collector-base and base-emitter capacitances of Q3 and Q4;
b) parasitic collector-substrate capacitances of Q3 and Q4;
c) substrate capacitance of the resistors R1 and R2;
d) collector-base capacitance of Q1 and Q2;
e) parasitic collector-substrate capacitances of Q1 and Q2; and
f) the output load, which is usually at least the collector-base and base-emitter capacitances of emitter followers or of a differential pair.

Items a, b, and c above are inherently part of the regenerative latch, whereas items d, e, and f are associated with the circuitry used to couple signals into and out of the latch.

In order to use this circuit as a high speed latching comparator and to reduce the loading due to the above circumstances, various modifications have been made up to now. These modifications have included in particular the use of emitter followers in the latch, and a split collector load resistor. These modifications have provided a higher loop gain in the latch, a higher collector-base voltage for Q3 and Q4, together with some degree of isolation of the capacitances of the input pair, Q1 and Q2, and of the output load from the loop involving Q3 and Q4 when the regeneration takes place. However, also when taking into account all of these modifications, the value of the regeneration time constant has always been limited to some degree by the above loadings.

SUMMARY OF THE INVENTION

The present invention solves the aforementioned prior art problems by providing a comparator, having a comparator input receiving a first input signal and a second input signal during an acquisition mode, and having a comparator output outputting a comparator output signal indicative of the largest between the first input signal and the second input signal, the comparator comprising: a cross-coupled regenerative latch for regenerating, during a latching mode, a signal which is indicative of a difference between the first input signal and the second input signal; a circuit connected to the cross-coupled regenerative latch, operating as a voltage follower during the acquisition mode and as a cascode amplifier stage during the latching mode; and a clocking circuit for switching the comparator from the acquisition mode to the latching mode and vice versa.

According to a second object of the present invention, a comparator is provided, having a comparator input receiving a first input signal and a second input signal during an acquisition mode, and having a comparator output outputting a comparator output signal indicative of the largest between the first input signal and the second input signal, the comparator comprising:

a cross-coupled regenerative latch for regenerating, during a latching mode, a signal which is indicative of a difference between the first input signal and the second input signal, said cross-coupled regenerative latch comprising:
   a first and a second resistor, each of said first and second resistor having a first end and a second end, and a first and a second bipolar transistor, wherein the collector of the first transistor and the base of the second transistor are connected to the first end of the first resistor, the collector of the second transistor and the base of the first transistor are connected to the first end of the second resistor, and the emitter of the first transistor is connected to the emitter of the second transistor;
a circuit connected to the cross-coupled regenerative latch, operating as a voltage follower to couple the comparator input into the latch during the acquisition mode and as a cascode amplifier stage to couple a latch state to the comparator output during the latching mode, said circuit comprising:
   a third and a fourth resistor, each of said third and fourth resistor having a first end and a second end, and
   a third and a fourth bipolar transistor, wherein the collector of the third transistor is connected to the second end of the third resistor and the collector of the fourth transistor is connected to the second end of the fourth resistor; and
a clocking circuit for switching the comparator from the acquisition mode to the latching mode and vice versa.

According to a further object of the present invention, a comparator is provided, having a comparator input receiving a first input signal and a second input signal during an acquisition mode, and having a comparator output outputting a comparator output signal indicative of the largest between the first input signal and the second input signal, the comparator comprising:
a cross-coupled regenerative latch for regenerating, during a latching mode, a signal which is indicative of a difference between the first input signal and the second input signal, said cross-coupled regenerative latch comprising:
   a first and a second resistor, each of said first and second resistor having a first end and a second end, and
   a first and a second field effect transistor, wherein the drain of the first transistor and the gate of the second transistor are connected to the first end of the first resistor, the drain of the second transistor and the gate of the first transistor are connected to the first end of the second resistor, and the source of the first transistor is connected to the source of the second transistor;
a circuit connected to the cross-coupled regenerative latch, operating as a voltage follower to couple the comparator input into the latch during the acquisition mode and as a cascode amplifier stage to couple a latch state to the comparator output during the latching mode, said circuit comprising:
   a third and a fourth resistor, each of said third and fourth resistor having a first end and a second end, and
   a third and a fourth field effect transistor, wherein the drain of the third transistor is connected to the second end of the third resistor and the drain of the fourth transistor is connected to the second end of the fourth resistor; and
a clocking circuit for switching the comparator from the acquisition mode to the latching mode and vice versa.

According to a preferred embodiment of the present invention, the cross-coupled regenerative latch comprises a first and a second resistor, each of the first and second resistor having a first end and a second end, and a first pair of three-terminal devices connected therebetween and to the first end of the first and second resistors.

Moreover, according to this preferred embodiment, the circuit comprises a second pair of three-terminal devices (for example bipolar transistors or field effect transistors) connected to the second end of the load resistors, the second pair of three-terminal devices operating as voltage followers to couple the first input signal and the second input signal into the second end of the load resistors and operating as cascode amplifier stages to couple the currents in the load resistors to the comparator output.

In particular, the comparator circuit according to the present invention eliminates all extraneous loading from the positive feedback when the regeneration takes place, so that a faster regeneration rate (shorter regeneration time constant) can be achieved. More particularly, all the extraneous loading associated with the input circuitry or the output circuitry is eliminated.

The shorter regeneration time constant of the comparator circuit according to the present invention allows the comparator circuit to resolve a smaller voltage difference in a given time, or resolve a given voltage difference more quickly or to reduce the probability that the comparator output will not be a valid logic signal to properly drive subsequent circuitry. In particular, the regeneration time constant is about the half of the regeneration time constant of the best prior art comparators.

The improved regeneration time constant of the disclosed comparator circuit will be the enabling technology for improved resolution or lowered noise floor in several types of high speed analog to digital converters. Also, particularly for parallel architectures that use large numbers of comparators, the comparator according to the present invention will allow a given speed and resolution to be achieved with lower power dissipation.

The present invention will be best understood from the following description when read in conjunction with the accompanying drawings.

DETAILED DESCRIPTION OF THE INVENTION

Figure 2:
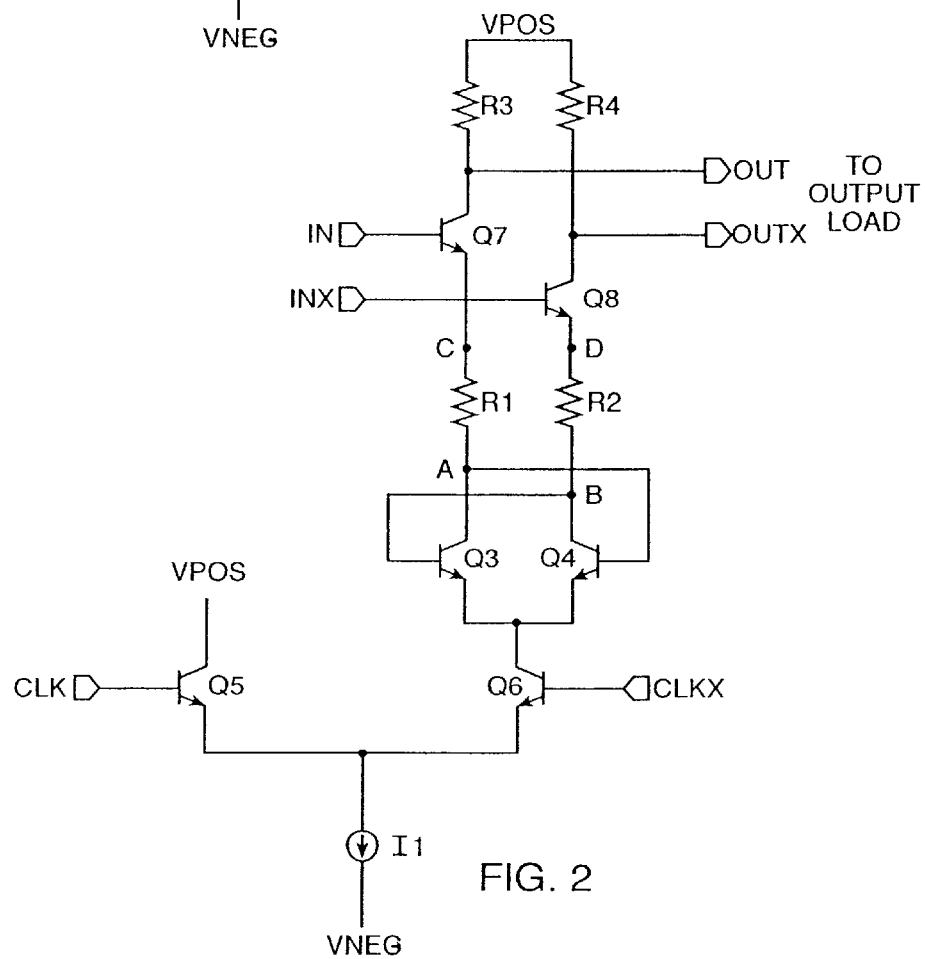
FIG. 2 is a circuit diagram showing the comparator circuit according to a first embodiment of the present invention.

FIG. 2 is a circuit diagram showing the comparator circuit according to the present invention, in its most basic form.

The basic regenerative loop, or latching circuit, comprises transistors Q3, Q4 and resistors R1 and R2. The input signals IN and INX are input into the bases of the transistors Q7 and Q8, respectively. The output signals OUT and OUTX are taken from the collectors of Q7 and Q8, respectively. The input voltage difference at the bases of Q7 and Q8 is coupled into resistors R1 and R2 to become the initial input voltage of the latching circuit comprising transistors Q3 and Q4 when the clock inputs CLK and CLKX are switched to steer current from the current source I1 into the latch and cause the positive feedback to become active.

In the circuit of FIG. 2, the rate of regeneration when the positive feedback is enabled is determined by the rate at which the voltage difference between the collector terminals of Q3 and Q4 can change. This rate in turn is determined by the current available to drive the collector terminals of Q3 and Q4 divided by the total capacitance at the collector terminals of Q3 and Q4.

Figure 1:
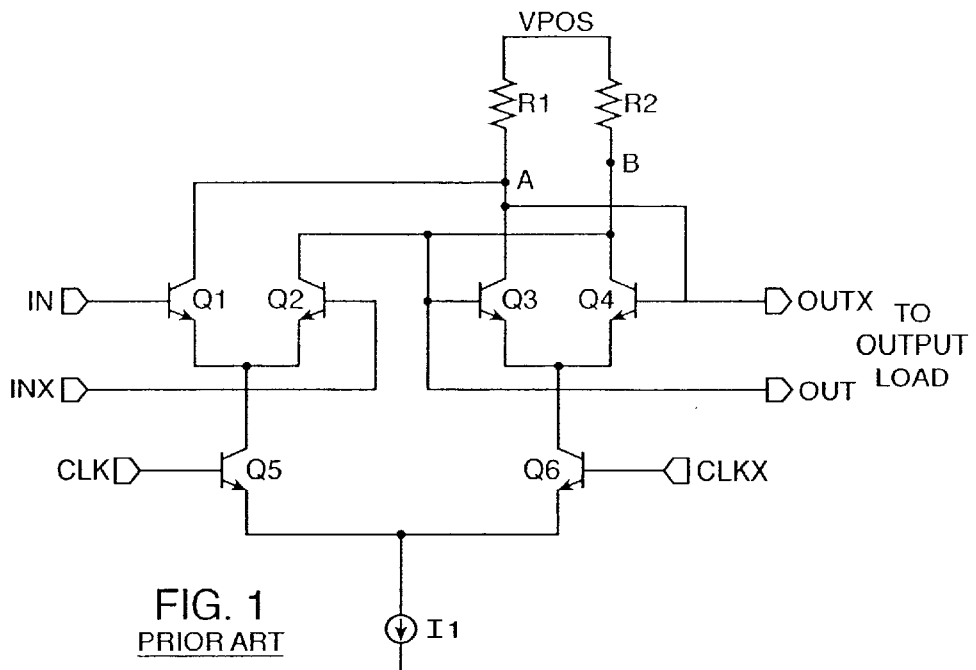
FIG. 1, already discussed in detail, shows a simplified electrical circuit of a prior art differential current-mode latch.

The available current, determined by the voltage difference present across the base terminals of the differential pair Q3–Q4, is the same for both the comparator according to the present invention and an equivalent (same integrated circuit technology, and operating at the same bias current) prior art comparator like the one shown in FIG. 1. However, in the comparator according to the present invention as shown in FIG. 2, the collector of Q3 is only connected to the base of Q4 and to resistor R1. Similarly, the collector of Q4 is only connected to the base of Q3 and to resistor R2. As already pointed out with reference to the loading of the transistors Q3 and Q4 of FIG. 1, each element connected to the collector of Q3 or Q4 contributes to the total parasitic capacitance at that collector and is thus part of the limitation on the rate of regeneration. From a comparison between the connections of the collectors of Q3 and Q4 in FIG. 2, it follows that the rate of regeneration in the prior art comparator is inherently smaller than the rate of regeneration in the comparator according to the present invention. More particularly, the loading of the latch transistor pair according to the present invention consists only of:

a) collector-base and base-emitter capacitances of Q3 and Q4;
b) parasitic collector-substrate capacitances of Q3 and Q4; and
c) substrate capacitance of the resistors R1 and R2.

The comparator according to the present invention achieves its advantage because transistors Q7 and Q8 in FIG. 2 act as voltage followers (high input impedance, low output impedance, and near-unity gain) to couple the input voltage difference into the latch through the low impedance ends C and D of the load resistors R1 and R2, without loading the high impedance nodes A and B, while at the same time acting as cascodes (low input impedance, high output impedance, and near-unity current gain) to pass the current in the load resistors R1 and R2 through the output with substantially unity current gain, again without loading the high impedance nodes A and B of the latch. If the output current is coupled into load resistors, shown as R3 and R4 in FIG. 2, the output is then converted to a voltage. Alternatively, the output current from the collectors of Q3 and Q4 could be used directly to drive a current-operated circuit such as a current mirror.

Figure 3:
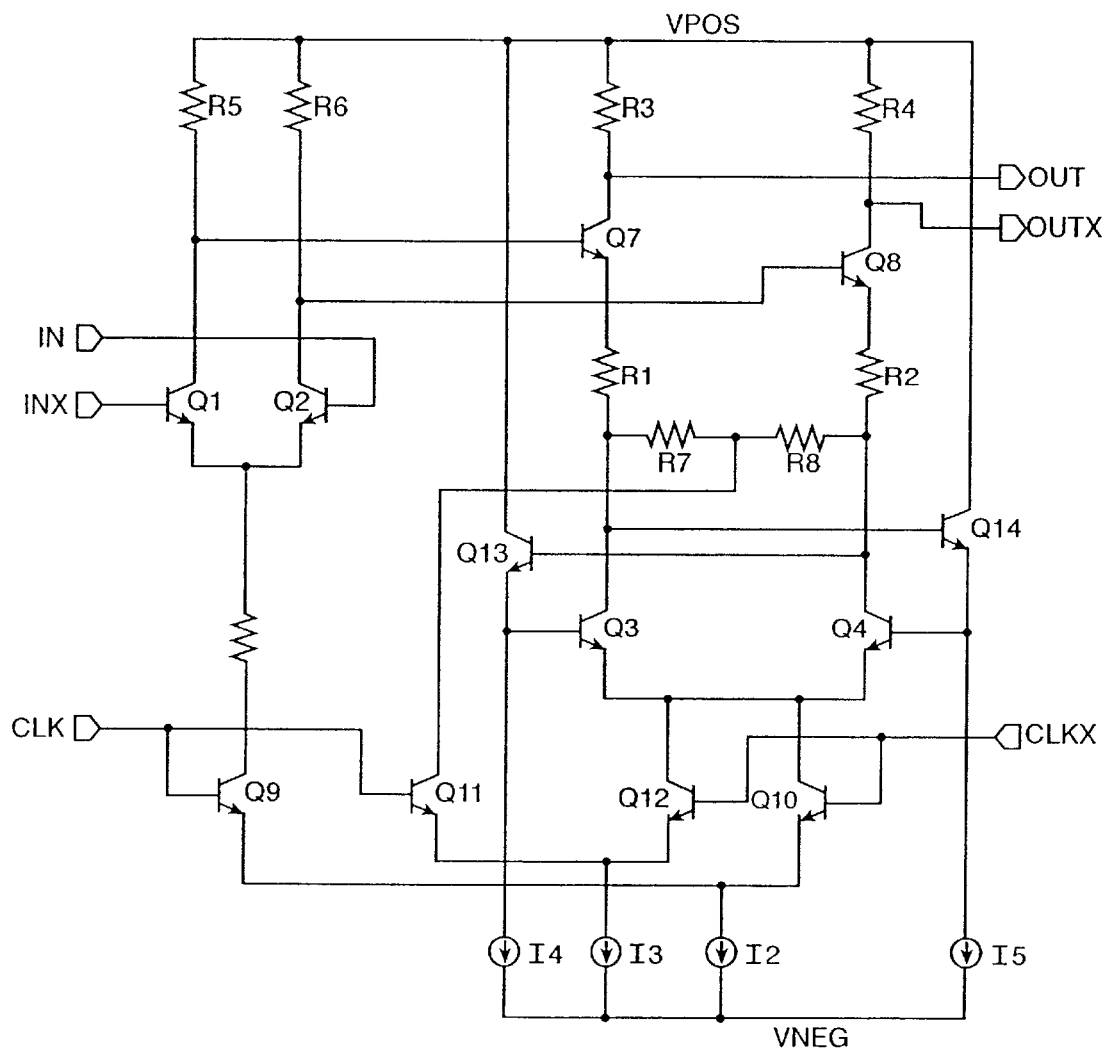
FIGS. 3–6 are circuit diagrams showing the comparator circuit according to further embodiments of the present invention.

FIG. 3 shows a preferred embodiment of the present invention, where further refinements are added to the basic circuit of FIG. 2. In the circuit of FIG. 3, R1=R2, R3=R4, R5=R6, R7=R8 and I4=I5. The circuit of FIG. 3 is likely to be preferred in an application where the shortest possible regeneration time is required and minimum power dissipation is not critical. On the contrary, in a parallel, or flash, analog to digital converter that uses a very large number of comparators so that the size and power consumption of the comparator are important, the simpler comparator of FIG. 2 may be preferred if it provides an adequately short regeneration time.

In FIG. 3, the difference between the input signals IN and INX is buffered through a differential pair Q1 and Q2, such that the input is isolated from the latch when the circuit is clocked into latching mode. Moreover, the latch Q3–Q4 includes emitter followers Q13 and Q14 to allow a larger voltage swing and thus a higher regeneration gain, and also so that the current gain of the emitter followers will reduce the loading of the collectors of Q3 and Q4 from the bases of Q4 and Q3, respectively.

The current that is clocked into the latch is split into two parts, I2 and I3. During acquisition mode, I2 is steered into the input pair Q1 and Q2, while I3 is steered through the resistors R7 and R8 to provide a bias current for transistors Q7 and Q8. The junction of R7 and R8 is a virtual ground for the differential signal, so that the collector capacitance of Q11 does not load the latch.

The voltage difference between CLK and CLKX is the 'clock voltage'. Similarly to what explained with reference to FIGS. 1 and 2, the clock voltage controls whether the comparator is sensing the voltage difference at the inputs IN and INX (acquisition mode) or has the positive feedback enabled so that it regenerates to a full logic swing at the outputs (latching mode).

When the clock voltage is high (positive) the comparator is in acquisition mode. This means that the current from the current source I2 is steered through transistor Q9 into the input pair Q1–Q2. The current from the current source I3 is steered through the transistor Q11 and split by the resistors R7+R1 and R8+R2 into the emitters of Q7 and Q8. In this acquisition mode, the input voltage between IN and INX is amplified by the differential amplifier Q1–Q2+R5–R6 and the amplified signal is applied to the bases of Q7 and Q8. The amplified signal voltage difference at the bases of Q7 and Q8 is approximately replicated at the emitters of these transistors. This amplified signal then appears at the collectors of the latch transistors Q3 and Q4 after being attenuated by a factor of R7/(R1+R7). In the acquisition mode the gain from the bases of Q7 and Q8 to the output is approximately −R3/(R1+R7).

In regeneration mode, when the clock voltage is low, the transistors Q3 and Q4, together with the load impedance formed by the combination of resistors R1, R2, R7, R8, and the emitter impedances of Q7 and Q8, form a differential amplifier. The output of the amplifier at the collectors of Q3 and Q4 is connected in positive feedback to the inputs at the bases of Q4 and Q3 respectively through the emitter followers Q13 and Q14 to form a regenerative latching circuit.

When the clock voltage is switched low the currents from the current sources I2 and I3 are steered through transistors Q10 and Q12 into the node that is common to the emitters of Q3 and Q4. This causes the regenerative circuit containing the transistors Q3, Q4, Q13 and Q14 to become active so that the voltage difference between the collectors of Q3 and Q4 will be regeneratively amplified to the point that nearly all of the current flows through one of the transistors Q3 or Q4 and into the load, where it is coupled through Q7 and Q8 into R3 and R4 to generate the output voltage. As seen by the output current, transistors Q7 and Q8 act as cascodes. The cross-coupling in the load provided by resistors R7 and R8 ensures that both transistors Q7 and Q8 are biased on, even when the collector current of one of transistors Q3 or Q4 is nearly zero. This limits the voltage step at the emitters of Q3 and Q4 when the comparator is switched to acquisition mode and thus shortens the time required for the input to settle.

It is worth noting that resistors R7 and R8 could alternatively be connected to the top of resistors R1 and R2 rather than the bottom, or alternatively, rather than being tied only to the top or bottom of R1 and R2, R7 and R8 could be tied to taps somewhere in the middle of each of R1 and R2 without substantially altering the function of the circuit.

The rate of regeneration is limited by the parasitic capacitive loading seen by the differential signal between the collectors of Q3 and Q4. The parasitic capacitance of the inventive circuit of FIG. 3 consists of:
a) the base-collector and base-emitter capacitances of the emitter followers Q13 and Q14;
b) the collector-base and collector-substrate capacitances of Q3 and Q4;
c) the parasitic capacitances of the resistors R1, R2, R7, and R8, and
d) any parasitic capacitance of the interconnections between these components.

Prior art clocked regenerative comparators have all of these same parasitic capacitances (except for the capacitance of R7 and R8 which is usually very small compared to transistor capacitances) and have in addition the capacitances of the transistors used to couple the signal into the regenerative amplifier, and the capacitance of a load connected to the output of the amplifier. During the process of regeneration the voltage at the junction of R7, R8, and the collector of Q11 does not change in response to changes in the differential voltage between the collectors of Q3 and Q4. It is a virtual ground for the differential signal. As such, the capacitance of the collector of Q11 does not load the differential signal during regeneration.

The circuit shown in FIG. 3 has been simulated with models for an InP HBT process This process provides npn transistors having an InP substrate, AlInAs emitters and GaInAs bases and collectors. The $F_t$ frequency of these transistors is about 80 GHz and the $F_{max}$ frequency is about 130 GHz. The minimum emitter size is 2 microns square, and the minimum metal pitch is 6 microns. This process normally has two levels of interconnect metal, and tantalum nitride thin film resistors. The regeneration time constant (i.e. the growing rate of the input voltage difference) obtained is of about 4.7 psec which is two times faster than a regeneration time constant of a conventional latch with split collector load resistors.

According to the embodiment of FIG. 3, the input signal is isolated from the bases of Q7 and Q8 when the clock is low, so that a change in the input voltage will not disturb the state of the latch. This results in the base currents of Q1 and Q2 being switched on and off at the clock rate, which may be undesirable for some applications.

One alternative method of isolating the latch from the inputs without introducing an additional buffer stage is that of clocking current into clamping diodes wired between the collectors of transistors Q1 and Q2, such that the differential voltage swing at the collectors of Q1 and Q2 is limited to a value substantially smaller than the latch voltage swing when the clock is low. The tail current into the emitters of Q1 and Q2 can then be kept constant, so that very little of the clock signal is coupled back through the bases of transistors Q1 and Q2.

Figure 4:
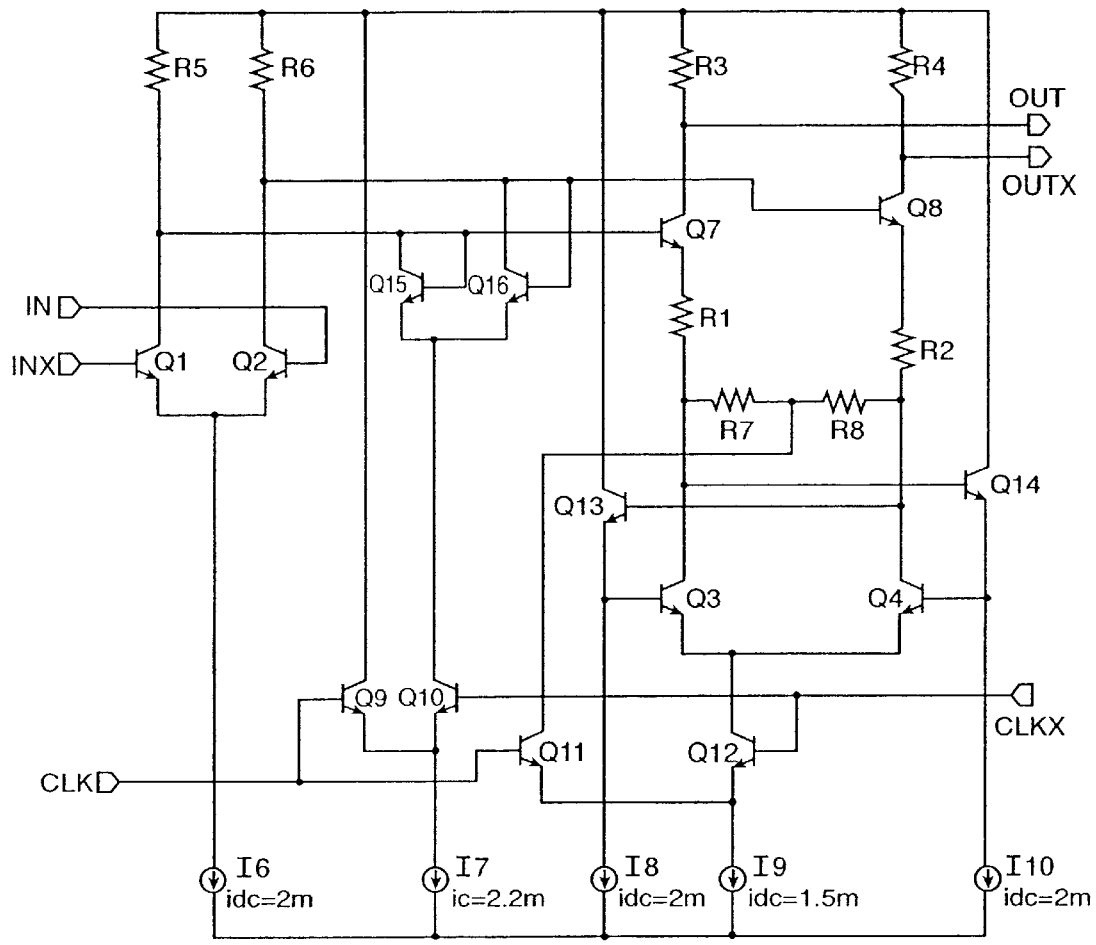

A circuit implementing this alternative method is shown in FIG. 4. In this embodiment, transistors Q1 and Q2 are biased with a constant current from current source I6. A pair of diode-connected transistors Q15 and Q16 are connected across the base leads of transistors Q7 and Q8. During the acquisition phase, when the signal CLK is high, no current flows in the transistors Q15 and Q16 so that they have a high impedance and have practically no effect on the circuit operation. When the signal CLK goes low and the comparator latches the current from the current source I7, the current is steered through transistor Q10 into transistors Q15 and Q16. In this way transistors Q15 and Q16 present a low impedance, shunting the resistors R1 and R2. This will prevent any large signal voltage from reaching the bases of Q7 and Q8 so that a change in the voltage between the signals IN and INX will not affect the state of the latch. With this form of clocking there will be essentially no modulation of the base currents of Q1 and Q2 by the clock.

Figure 5:
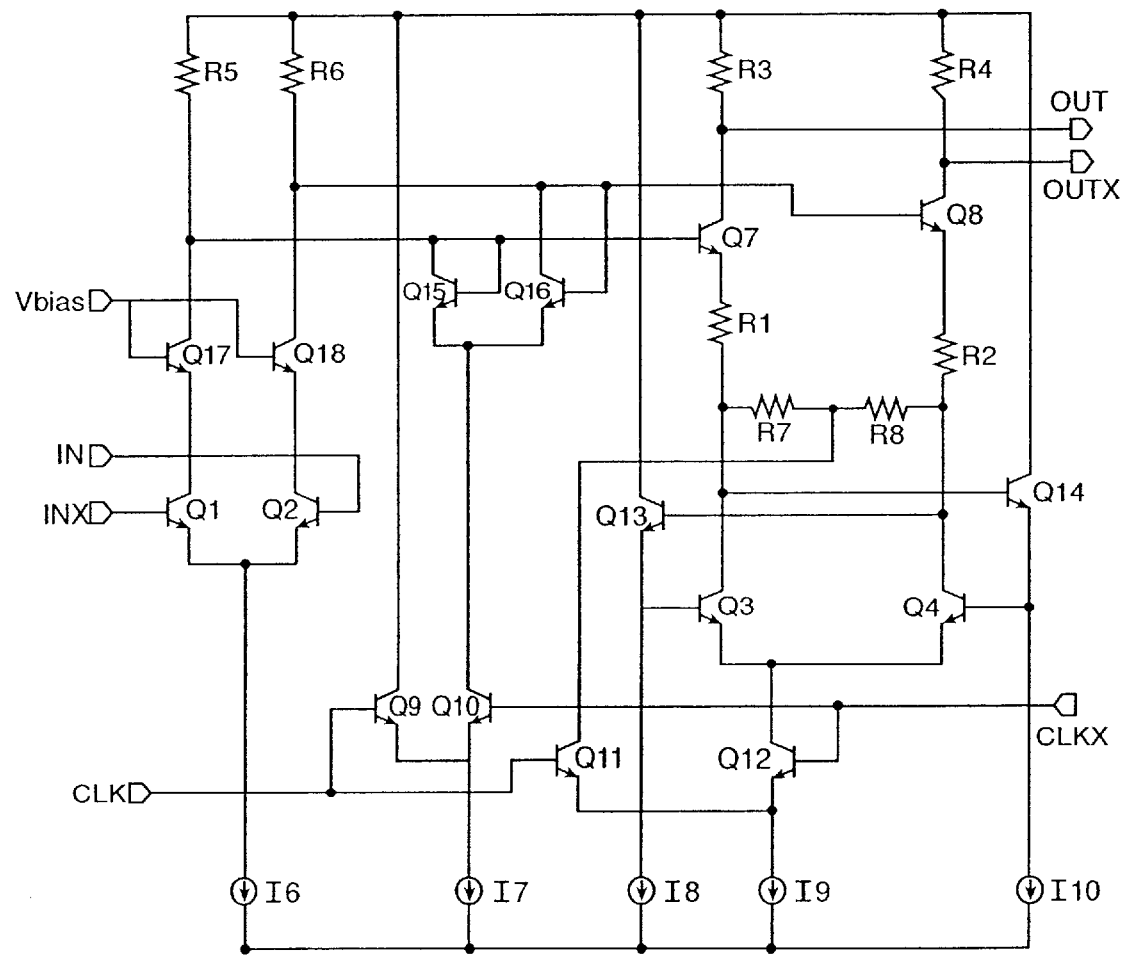

FIG. 5 shows a further enhancement to the embodiment of FIG. 4. In FIG. 5, cascode transistors Q17 and Q18 are added to the input amplifier Q1–Q2–R5–R6.

Transistors Q17–Q18 will provide isolation between the bottoms of R5 and R6 and the collector-base capacitances of transistors Q1 and Q2 so that the voltage swings at these resistors as the comparator is clocked are not coupled back through the bases into the circuitry that drives the comparator. Coupling of a signal voltage back through the collector-base capacitance of the input transistors of a strobed comparator as the comparator is clocked is known as "kickback", and is known to be a cause of problems in some circuit applications.

Figure 6:
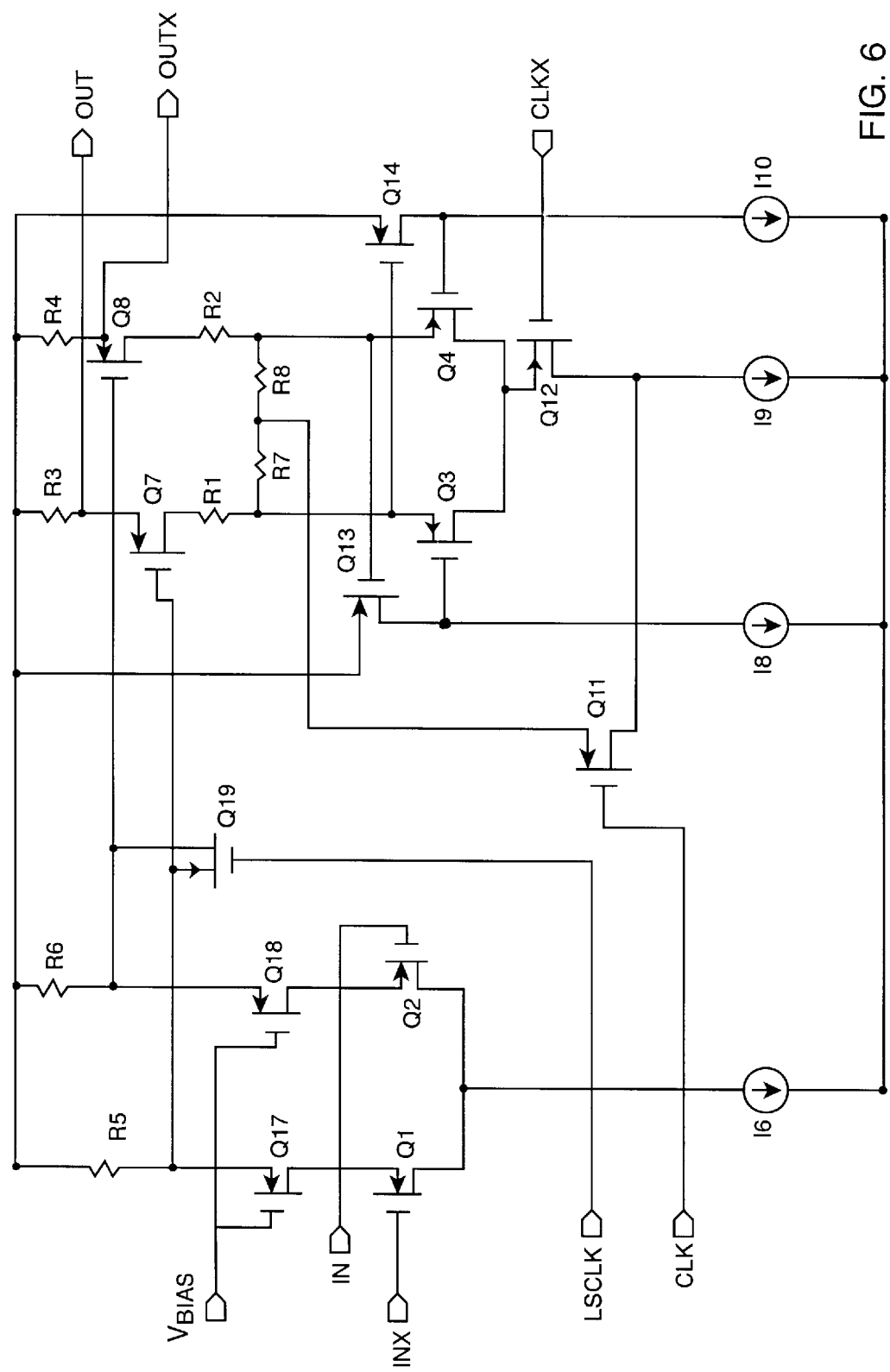

FIG. 6 shows an alternative embodiment to FIG. 5. The circuit in FIG. 6 performs the same function as the circuit in FIG. 5, except it is constructed using FET's. In both FIG. 5 and FIG. 6, when the comparator is switched to regeneration mode, the circuitry connected between the bases of Q7 and Q8 is switched to a low impedance state. This limits the voltage between the bases of Q7 and Q8 to less than the value required to change the state of the regenerative latch. In the version of circuitry shown in FIG. 5 the low impedance path is through the diode-connected transistors Q15 and Q16 when the current from I7 is steered through Q10 into those transistors. When FET's are used as in FIG. 6 it is more appropriate to use a single transistor Q19 connected as shown, so as to under the control of the clock signal, create the desired low impedance to effectively isolate the regenerative latch, i.e. limit the voltage between the bases of Q7 and Q8. A signal LSCLK which controls the operation of transistor Q19 may in some instances be identical to CLK, or depending on the threshold voltages and/or breakdown voltages of the transistor Q19 available in the particular process used to fabricate the circuit, might differ from CLK by a constant voltage difference.

The embodiments according to the present invention have been illustrated in terms of npn bipolar transistors and field effect transistors. It will be obvious to the person skilled in the art that equivalent circuits can be implemented with pnp transistors, either polarity of field effect transistors, or a mixture of these device types. Moreover, Q1 and Q2 of FIG. 2, or Q7 and Q8 of FIGS. 3, 4, 5, or 6 could be any type of three-terminal device for which a voltage between terminals 1 and 2 controls a current between terminals 2 and 3. Still moreover, the circuit block consisting of R1, R2, Q3 and Q4 is a three terminal block with the property that a current into one terminal creates a negative resistance between the other two terminals. Although in a preferred embodiment the output is taken at the collectors of transistors Q1 and Q2 (FIG. 2), Q7 and Q8 (FIGS. 3–5), and the drains of transistors Q7 and Q8 (FIG. 6) it is also possible to take the output at the collectors of transistors Q3 and Q4, the emitters of Q13 and Q14, the drains of Q3 and Q4, and the sources of Q13 and Q14, although either of these output connections will add some loading to the high impedance nodes of the regenerative latch and partly negate the advantage of this circuit.

The circuit according to the present invention can be used also in asynchronous logic, due to its potential of greatly reducing the probability of metastability in a latch. At the interface between asynchronous logic and conventional clocked logic it is generally impossible to guarantee that an asynchronous logic transition will not occur just at the clock transition such as to leave a latch in a metastable state. If sufficient time is left before the latch must be read out, the probability of its remaining in a metastable state can become very small. The time required to reach a given probability is a multiple of the regeneration time constant of the latch. If the comparator circuit according to the present invention is used as a latch, it will require a shorter time to reach a given probability of no error than would be required for any previously known latch. For a reference on metastability see Veendrick, H. J. M., "The Behavior of Flip-Flops Used as Synchronizers and prediction of Their Failure Rates", IEEE J. Solid-State Circuits, vol. SC-15, No. 2, April 1980.

Finally, it is to be understood that the comparator circuit according to the present invention also can take into account usual tradeoffs that can be made in the detailed design of the new comparator in order to optimize it for a particular application implemented in any given integrated circuit technology. For example, these tradeoffs may be related to optimizing the circuit performance with respect to device characteristics peculiar to a particular integrated circuit technology, trading power consumption against circuit speed, trading circuit performance against the area occupied by the circuit, etc. One example would be to increase the gain of the positive feedback loop by increasing the voltage drop across the load resistors, which then necessitates the use of emitter follower level shifters with a concomitant increase in power dissipation and in area occupied by the circuit. In any case, for a given set of design tradeoffs and in a given integrated circuit technology, the new comparator circuit will always have a shorter regeneration time than a prior art comparator.

While several illustrative embodiments of the invention have been shown and described, numerous variations and alternative embodiments will occur to those skilled in the art. Such variations and alternative embodiments are contemplated, and can be made without departing from the spirit and scope of the invention as defined in the appended claims.

What is claimed is:

1. A comparator, having a comparator input receiving a first input signal and a second input signal during an acquisition mode, and having a comparator output outputting a comparator output signal indicative of the largest between the first input signal and the second input signal, the comparator comprising:
   a cross-coupled regenerative latch for regenerating, during a latching mode, a signal which is indicative of a difference between the first input signal and the second input signal;
   a circuit connected to the cross-coupled regenerative latch, operating as a voltage follower to couple the comparator input into the latch during the acquisition mode and as a cascode amplifier stage to couple a latch state to the comparator output during the latching mode; and
   a clocking circuit for switching the comparator from the acquisition mode to the latching mode and vice versa.

2. The comparator of claim 1, wherein:
   said cross-coupled regenerative latch comprises
      a first and a second resistor each of said first and second resistor having a first end and a second end, and
      a first pair of three-terminal devices connected therebetween and to the first end of said first and second resistors; and
   said circuit comprises
      a second pair of three-terminal devices, said second pair of three-terminal devices operating as voltage followers to couple the first input signal and the second input signal into the second end of the load resistors and operating as cascode amplifier stages to couple the currents in the load resistors to the comparator output.

3. The comparator of claim 1, wherein the comparator output is a voltage difference signal.

4. The comparator of claim 2, wherein the comparator output is a voltage difference signal.

5. The comparator of claim 4, wherein said circuit further comprises a third and a fourth resistor, each of said third and fourth resistor having a first end connected to a voltage source and a second end connected to a respective three-terminal device of the second pair of three-terminal devices, a difference between voltages of the second end of said third and fourth resistor forming said comparator output.

6. The comparator of claim 1, wherein the comparator output is a current difference signal.

7. The comparator of claim 1, further comprising a first current generator connected to said clocking circuit, said clocking circuit steering current from said first current generator into said regenerative latch during said latching mode.

8. The comparator of claim 2, further comprising a first current generator connected to said clocking circuit, said clocking circuit steering current from said first current generator into said regenerative latch during said latching mode.

9. The comparator of claim 8, wherein said clocking circuit also steers current from said first current generator into said second pair of three-terminal devices during the acquisition mode, to bias said second pair of three-terminal devices during the acquisition mode.

10. The comparator of claim 8, further comprising an input buffer circuit connected to said second pair of three-terminal devices, said input buffer circuit receiving said first and second input signal and isolating said first and second input signal from said regenerative latch during said latching mode.

11. The comparator of claim 10, further comprising a second current generator connected to said clocking circuit, said clocking circuit steering current from said second current generator into said regenerative latch during said latching mode and steering current into said input buffer circuit during said acquisition mode.

12. The comparator of claim 1, wherein said cross-coupled regenerative latch further comprises a fifth and a sixth resistor, at least part of the latch current being steered into the junction of said fifth and sixth resistor during acquisition.

13. The comparator of claim 12, wherein said fifth and sixth resistor are connected between the first end of the first resistor and the first end of the second resistor.

14. The comparator of claim 12, wherein said fifth and sixth resistor are connected between the second end of the first resistor and the second end of the second resistor.

15. The comparator of claim 9, wherein said cross-coupled regenerative latch further comprises a fifth and a sixth resistor, at least part of the latch current being steered into the junction of said fifth and sixth resistor during acquisition.

16. The comparator of claim 15, wherein said fifth and sixth resistor are connected between the first end of the first resistor and the first end of the second resistor.

17. The comparator of claim 15, wherein said fifth and sixth resistor are connected between the second end of the first resistor and the second end of the second resistor.

18. The comparator of claim 2, wherein said cross-coupled regenerative latch further comprises a third pair of three-terminal devices, operating as voltage followers during said latching mode.

19. The comparator of claim 18, further comprising a first current generator connected to said clocking circuit, said clocking circuit steering current from said first current generator into said regenerative latch during said latching mode.

20. The comparator of claim 19, wherein said clocking circuit also steers current from said first current generator into said second pair of three-terminal devices during the acquisition mode, to bias said second pair of three-terminal devices during the acquisition mode.

21. The comparator of claim 19, further comprising an input buffer circuit connected to said second pair of three-terminal devices, said input buffer circuit receiving said first and second input signal and isolating said first and second input signal from said regenerative latch during said latching mode.

22. The comparator of claim 21, further comprising a second current generator connected to said clocking circuit, said clocking circuit steering current from said second current generator into said regenerative latch during said latching mode and steering current into said input buffer circuit during said acquisition mode.

23. The comparator of claim 15, wherein said cross-coupled regenerative latch further comprises a fifth and a sixth resistor, at least part of the latch current being steered into the junction of said fifth and sixth resistor during acquisition.

24. The comparator of claim 23, wherein said fifth and sixth resistor are connected between the first end of the first resistor and the first end of the second resistor.

25. The comparator of claim 23, wherein said fifth and sixth resistor are connected between the second end of the first resistor and the second end of the second resistor.

26. The comparator of claim 2, further comprising a combination of devices that can, under the control of the clock signal, be switched to a low impedance state to effectively isolate said cross-coupled regenerative latch from said first input signal and second input signal during said latching mode.

27. The comparator of claim 26, wherein said comparator input is fed to an input amplifier, and wherein said combination of devices is located between said input amplifier and said cross-coupled regenerative latch.

28. The comparator of claim 27, wherein said input amplifier further comprises a cascode circuit.

29. A comparator, having a comparator input receiving a first input signal and a second input signal during an acquisition mode, and having a comparator output outputting a comparator output signal indicative of the largest between the first input signal and the second input signal, the comparator comprising:
    a cross-coupled regenerative latch for regenerating, during a latching mode, a signal which is indicative of a difference between the first input signal and the second input signal, said cross-coupled regenerative latch comprising:
        a first and a second resistor, each of said first and second resistor having a first end and a second end, and
        a first and a second bipolar transistor, wherein the collector of the first transistor and the base of the second transistor are connected to the first end of the first resistor, the collector of the second transistor and the base of the first transistor are connected to the first end of the second resistor, and the emitter of the first transistor is connected to the emitter of the second transistor;
    a circuit connected to the cross-coupled regenerative latch, operating as a voltage follower to couple the comparator input into the latch during the acquisition mode and as a cascode amplifier stage to couple a latch state to the comparator output during the latching mode, said circuit comprising:
        a third and a fourth resistor, each of said third and fourth resistor having a first end and a second end, and
        a third and a fourth bipolar transistor, wherein the collector of the third transistor is connected to the second end of the third resistor and the collector of the fourth transistor is connected to the second end of the fourth resistor; and
    a clocking circuit for switching the comparator from the acquisition mode to the latching mode and vice versa.

30. The comparator of claim 29, further comprising a first current generator connected to said clocking circuit, said clocking circuit steering current from said first current generator into said regenerative latch during said latching mode.

31. The comparator of claim 30, wherein said clocking circuit also steers current from said first current generator into said third and fourth transistor during the acquisition mode, to bias said third and fourth transistor during the acquisition mode.

32. The comparator of claim 30, further comprising an input buffer circuit connected to said third and fourth transistor, said input buffer circuit receiving said first and second input signal and isolating said first and second input signal from said regenerative latch during said latching mode.

33. The comparator of claim 32, further comprising a second current generator connected to said clocking circuit, said clocking circuit steering current from said second current generator into said regenerative latch during said latching mode and steering current into said input buffer circuit during said acquisition mode.

34. The comparator of claim 29, wherein said cross-coupled regenerative latch further comprises a fifth and a sixth resistor, at least part of the latch current being steered into the junction of said fifth and sixth resistor during acquisition.

35. The comparator of claim 34, wherein said fifth and sixth resistor are connected between the first end of the first resistor and the first end of the second resistor.

36. The comparator of claim 34, wherein said fifth and sixth resistor are connected between the second end of the first resistor and the second end of the second resistor.

37. The comparator of claim 29, wherein said cross-coupled regenerative latch further comprises a fifth and a sixth transistor, operating as emitter followers during said latching mode.

38. The comparator of claim 29, further comprising diode-connected transistors for isolating said cross-coupled regenerative latch from said first input signal and second input signal during said latching mode.

39. The comparator of claim 38, wherein said comparator input is fed to an input amplifier, said diode-connected transistors being located between said input amplifier and said cross-coupled regenerative latch.

40. The comparator of claim 39, wherein said input amplifier further comprises a cascode circuit.

41. A comparator, having a comparator input receiving a first input signal and a second input signal during an acquisition mode, and having a comparator output outputting a comparator output signal indicative of the largest between the first input signal and the second input signal, the comparator comprising:
  a cross-coupled regenerative latch for regenerating, during a latching mode, a signal which is indicative of a difference between the first input signal and the second input signal, said cross-coupled regenerative latch comprising:
    a first and a second resistor, each of said first and second resistor having a first end and a second end, and
    a first and a second field effect transistor, wherein the drain of the first transistor and the gate of the second transistor are connected to the first end of the first resistor, the drain of the second transistor and the gate of the first transistor are connected to the first end of the second resistor, and the source of the first transistor is connected to the source of the second transistor;
  a circuit connected to the cross-coupled regenerative latch, operating as a voltage follower to couple the comparator input into the latch during the acquisition mode and as a cascode amplifier stage to couple a latch state to the comparator output during the latching mode, said circuit comprising:
    a third and a fourth resistor, each of said third and fourth resistor having a first end and a second end, and
    a third and a fourth field effect transistor, wherein the drain of the third transistor is connected to the second end of the third resistor and the drain of the fourth transistor is connected to the second end of the fourth resistor; and
  a clocking circuit for switching the comparator from the acquisition mode to the latching mode and vice versa.

42. The comparator of claim 41, further comprising a first current generator connected to said clocking circuit, said clocking circuit steering current from said first current generator into said regenerative latch during said latching mode.

43. The comparator of claim 41, further comprising a first current generator connected to said clocking circuit, said clocking circuit steering current from said first current generator into said regenerative latch during said latching mode.

44. The comparator of claim 43, wherein said clocking circuit also steers current from said first current generator into said third and fourth transistor during the acquisition mode, to bias said third and fourth transistor during the acquisition mode.

45. The comparator of claim 43, further comprising an input buffer circuit connected to said third and fourth transistor, said input buffer circuit receiving said first and second input signal and isolating said first and second input signal from said regenerative latch during said latching mode.

46. The comparator of claim 45, further comprising a second current generator connected to said clocking circuit, said clocking circuit steering current from said second current generator into said regenerative latch during said latching mode and steering current into said input buffer circuit during said acquisition mode.

47. The comparator of claim 41, wherein said cross-coupled regenerative latch further comprises a fifth and a sixth resistor, at least part of the latch current being steered into the junction of said fifth and sixth resistor during acquisition.

48. The comparator of claim 47, wherein said fifth and sixth resistor are connected between the first end of the first resistor and the first end of the second resistor.

49. The comparator of claim 47, wherein said fifth and sixth resistor are connected between the second end of the first resistor and the second end of the second resistor.

50. The comparator of claim 41, wherein said cross-coupled regenerative latch further comprises a fifth and a sixth transistor, operating as source followers during said latching mode.

51. The comparator of claim 41, further comprising a isolating transistor connected so as to, under control of the clock signal, substantially isolate said regenerative latch from said first input signal and second input signal during said latching mode.

52. The comparator of claim 51, wherein said comparator input is fed to an input amplifier, and wherein said isolating transistor is located between said input amplifier and said cross-coupled regenerative latch.

53. The comparator of claim 52, wherein said input amplifier further comprises a cascode circuit.

* * * * *